(12) United States Patent
Kornilovich et al.

(10) Patent No.: US 11,110,456 B2
(45) Date of Patent: Sep. 7, 2021

(54) BEAD PACKING IN MICROFLUIDIC CHANNELS

(71) Applicant: HEWLETT-PACKARD DEVELOPMENT COMPANY, L.P., Houston, TX (US)

(72) Inventors: Pavel Kornilovich, Corvallis, OR (US); Alexander Govyadinov, Corvallis, OR (US); David P. Markel, Corvallis, OR (US); Erik D. Torniainen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 371 days.

(21) Appl. No.: 16/099,246

(22) PCT Filed: Jul. 12, 2016

(86) PCT No.: PCT/US2016/041924
§ 371 (c)(1),
(2) Date: Nov. 6, 2018

(87) PCT Pub. No.: WO2018/013091
PCT Pub. Date: Jan. 18, 2018

(65) Prior Publication Data
US 2019/0151846 A1    May 23, 2019

(51) Int. Cl.
*B01L 3/00* (2006.01)
*G01N 30/56* (2006.01)
(Continued)

(52) U.S. Cl.
CPC ....... *B01L 3/502753* (2013.01); *B01L 3/5025* (2013.01); *B01L 3/502715* (2013.01);
(Continued)

(58) Field of Classification Search
CPC ....... B01L 3/502753; B01L 2200/0642; B01L 2200/0647; B01L 2200/143;
(Continued)

(56) References Cited

U.S. PATENT DOCUMENTS

| | | | | |
|---|---|---|---|---|
| 5,863,801 A | * | 1/1999 | Southgate | .......... C12N 15/1013 436/63 |
| 2003/0217923 A1 | | 11/2003 | Harrison et al. | |

(Continued)

FOREIGN PATENT DOCUMENTS

| TW | 200916183 A | 4/2009 |
|---|---|---|
| WO | WO-2016065056 A1 | 4/2016 |

OTHER PUBLICATIONS

Liang-Hsuan Lu, Kee Suk Ryu and Chang Liu, "A magnetic microstirrer and array for microfluidic mixing," Oct. 2002, Journal of Microelectromechanical Systems, vol. 11, No. 5, pp. 462-469. (Year: 2002).*

(Continued)

*Primary Examiner* — Jill A Warden
*Assistant Examiner* — Henry H Nguyen
(74) *Attorney, Agent, or Firm* — Dicke Billig & Czaja PLLC

(57) ABSTRACT

A microfluidic bead-packing method includes activating a first micropump to transfer active microbeads through an inlet microchannel from a bead suspension reservoir to an adsorbing channel; packing the microbeads in the adsorbing channel; and activating a second micropump to reverse flow through at least a portion of the inlet microchannel and to transfer a sample fluid through the inlet microchannel from a sample reservoir to the adsorbing channel such that the sample fluid interacts with the packed microbeads.

14 Claims, 7 Drawing Sheets

(51) Int. Cl.
*G01N 30/10* (2006.01)
*B01D 15/08* (2006.01)
*G01N 30/40* (2006.01)
*G01N 30/60* (2006.01)
*B81C 1/00* (2006.01)

(52) U.S. Cl.
CPC .... *B01L 3/502761* (2013.01); *B81C 1/00206* (2013.01); *G01N 30/10* (2013.01); *G01N 30/56* (2013.01); *B01D 15/08* (2013.01); *B01L 3/502738* (2013.01); *B01L 2200/0642* (2013.01); *B01L 2200/0647* (2013.01); *B01L 2200/143* (2013.01); *B01L 2300/0663* (2013.01); *B01L 2300/0681* (2013.01); *B01L 2300/0864* (2013.01); *B01L 2300/0867* (2013.01); *B01L 2400/0406* (2013.01); *B81B 2201/051* (2013.01); *G01N 30/6095* (2013.01); *G01N 2030/405* (2013.01); *G01N 2030/562* (2013.01)

(58) Field of Classification Search
CPC ..... B01L 2300/0681; B01L 2300/0864; B01L 2400/0406; B01L 3/502761; B01L 2300/0867; B01L 2300/0663; B81C 1/00206; G01N 30/10; G01N 30/56; G01N 2030/405; G01N 30/6095; G01N 2030/562; B81B 2201/051; B01D 15/08
See application file for complete search history.

(56) References Cited

U.S. PATENT DOCUMENTS

| | | |
|---|---|---|
| 2004/0241718 A1 | 12/2004 | McGown |
| 2005/0051489 A1 | 3/2005 | Tai et al. |
| 2006/0147344 A1 | 7/2006 | Ahn et al. |
| 2007/0116594 A1 | 5/2007 | Shimizu et al. |
| 2010/0151465 A1 | 6/2010 | Ju et al. |
| 2010/0204065 A1 | 8/2010 | Kim et al. |
| 2011/0308325 A1* | 12/2011 | Weissgerber ......... G01N 30/10 73/861 |
| 2012/0061305 A1 | 3/2012 | Quake et al. |
| 2014/0246321 A1 | 9/2014 | Tsukada et al. |
| 2015/0011404 A1 | 1/2015 | Prakash et al. |
| 2015/0093743 A1 | 4/2015 | Sadri et al. |
| 2015/0360468 A1 | 12/2015 | Taff |

OTHER PUBLICATIONS

Qing He et al, Ion liquid chromatography on-a-chip with beads-packed parylene column, Micro Electro Mechanical Systems, 2004. 17th IEEE International Conference on. (MEMS) Maastricht, Netherlands, Jan. 25-29, 2004, Piscataway, NJ, USA, IEEE, US, Jan. 25, 2004, pp. 212-215.

* cited by examiner

BEAD PACKING IN MICROFLUIDIC CHANNELS

BACKGROUND

Many microfluidic applications may benefit from contacting a fluid sample with an active surface. The larger surface area of active-surface microbeads makes them appealing for supporting chemical and biological interactions.

BRIEF DESCRIPTION OF THE DRAWINGS

Throughout the drawings, identical reference numbers designate similar, but not necessarily identical, elements.

DETAILED DESCRIPTION

One example of this disclosure provides scalable systems and methods of filling micro-channels with beads based on the usage of integrated inertial and/or capillary pumps. The methods described herein permit for packing channels with active beads without involving high pressures or special fabrication procedures. For example, a suspension of beads is passed through a mechanical filter using a pump, such as a capillary or inertial micro-pump. The beads obstruct the filter thus creating a volume that is densely packed with the beads. Following bead packing, a fluid sample of interest is passed through the packed volume of beads inducing interaction between the beads' surfaces and the objects of interest in the sample fluid.

As used herein, the term "fluid" is meant to be understood broadly as any substance, such as, for example, a liquid or gas, that is both capable of flowing and that changes its shape at a steady rate when acted upon by a force tending to change its shape.

Also, as used herein, the term "microfluidic" is meant to be understood to refer to systems having flow, bead-packing and/or mixing channels sufficiently small in size (e.g., less than a few millimeters, including down to the nanometer range) such that surface tension, energy dissipation, and fluidic resistance factors start to dominate the system. Additionally, the Reynolds number becomes very low, and side-by-side fluids in a straight channel flow laminarly rather than turbulently. In some examples, a microfluidic channel is less than one millimeter in width as measured at a cross-section normal to the net direction of flow through the microfluidic channel, where "width" encompasses "diameter" for channels of cylindrical geometry. In other examples, the width of a microfluidic channel is less than 500 microns, such as less than 200 microns or less than 100 microns.

References to "beads," "channels," or "pumps" should be understood to refer to microbeads, microchannels, and micropumps, respectively.

Further, as used herein, the term "a number of" or similar language is meant to be understood as including any positive integer.

Figure 1:
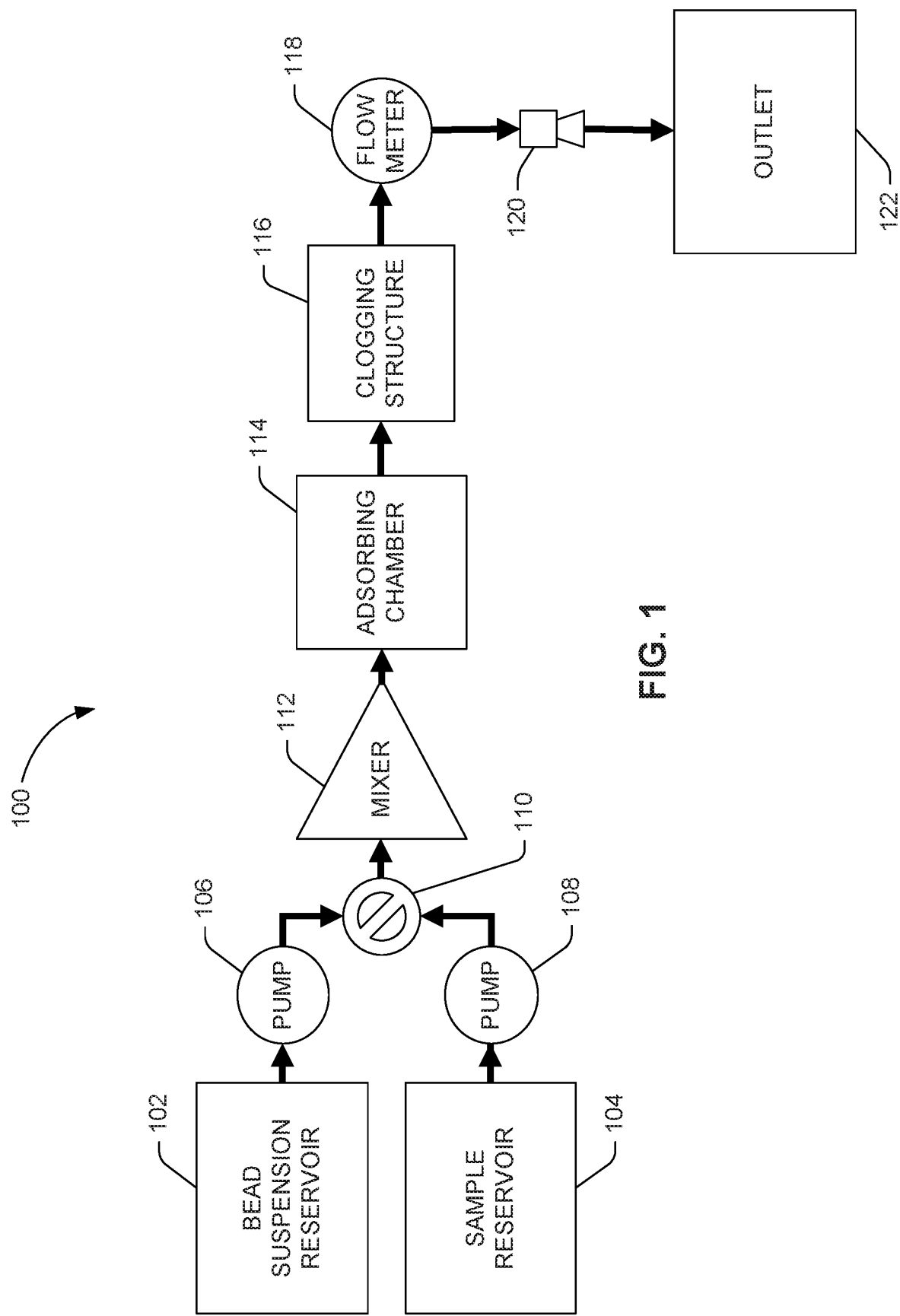
FIG. 1 system flow diagram depicting an example of a microfluidic bead-packing system.

Turning now to the figures, FIG. 1 is a system flow diagram depicting an example of a microfluidic bead-packing system 100. The microfluidic bead-packing system 100 can pass a suspension of active beads, initially stored in bead suspension reservoir 102, through a clogging structure 116 using a number of integrated micropumps 106 to tightly pack the space behind the clogging structure 116 in an adsorption chamber 114.

In some examples, the clogging structure 116 may be a filter. A filter consists of a number of structures, or a repeating structure, having a porosity so defined as to block the passage of microbeads but permit the passage of objects of interest in a sample fluid. In some examples, the clogging structure 116 may be a constriction. A constriction consists of a narrowing of the width of the adsorbing chamber 114, or some outlet channel fluidly connected to the adsorbing chamber 114, so as to create an outlet hole or port of width less than the diameter of microbeads but greater than objects of interest in a sample fluid. In some examples, the clogging structure 116 can consist of a number of filters and/or a number of constrictions.

In some examples, the adsorbing chamber 114 may be a channel. In some examples, the adsorbing chamber 114 may be a reservoir. In some examples, the adsorbing chamber 114 may be a structure that functions at times as a channel and at times as a reservoir depending on the activation of flow-promoting or flow-prohibiting devices, for example, outlet nozzle(s) 120 and/or pumps 106, 108.

Later, a fluid sample initially stored in a sample reservoir 104 can be passed through the bead clogging filter 116 so that objects of interest in the sample fluid can interact with the active-surface microbeads. Bead suspension reservoir 102 can contain beads in a carrier fluid or a buffer.

As used herein, "packing" of microbeads means tightly filling a volume with microbeads, the volume being larger in width than the diameters of two microbeads. Microbeads closely aligned in single file in a channel are not to be considered "packed" under this definition. Tight filling means that, when at rest, packed microbeads in the volume are in physical contact with a plurality of neighboring microbeads. "Packing" does not require such tight or dense filling that packed microbeads are completely constrained from moving with respect to each other. For example, microbeads that are packed may still have enough freedom of movement to permit mixing by, for example, a microfluidic mixer device, such as mixer 112 disclosed herein.

Flow of the bead suspension and sample fluids can occur through a number of microfluidic channels indicated by arrows. Many of the illustrated components, including pumps 106, 108, valve 110, mixer 112, adsorbing chamber 114, filter 116, flow meter 118, and nozzle(s) 120 can be inside and/or integrated with the microfluidic channels. Although FIG. 1 illustrates a two-fluid circuit, the system may accommodate any number of fluids, including any number of sample fluids, with the addition of more fluid reservoirs 102, 104 and associated channels and/or pumps 106, 108. Micropumps 106, 108 can be any type of micropump, capillary or inertial.

An example process of operation of the microfluidic bead-packing system 100 in FIG. 1 can begin with priming the channels with a suspension of active beads from bead suspension reservoir 102. During priming, the bead suspension fluid can flow into the adsorbing chamber 114 where beads can collect and pack, constricted from further movement by filter 116. In the example two-fluid circuit illustrated in FIG. 1, the sample reservoir 104 can be either filled or unfilled during priming with the bead suspension.

A valve 110 can be actuated (e.g., in response to a control signal) to permit or deny movement of fluids from one, several, or all of the reservoirs 102, 104.

A microfluidic mixer 112, which can be a passive mixer or an active mixer, can mix, stir, and/or agitate beads and sample, helping efficient extraction via adsorption. An active mixer improves mixing performance by providing forces that speed up the diffusion process between the components being mixed. Active mixers may use a mechanical transducer that agitates the fluid components to improve mixing.

While adsorbing chamber 114 is being packed, suspension fluid can be drained to outlet 122 through outlet nozzle(s) 120. In some examples, outlet 122 is a waste chamber. In some examples, outlet 122 is a dispenser. In some examples, outlet 122 is a port to a later stage of a larger microfluidic analysis system of which the bead-packing adsorbing channel 114 is a part.

Once the adsorbing chamber 114 is packed with beads, sample fluid from sample reservoir 104 can be permitted to flow through the bead-packed adsorbing chamber 114 where sample objects of interest and active-surface microbeads may interact.

A flow meter 118 can measure flow out of the adsorbing chamber 114. The flow meter can be positioned after the filter 116. As the bed of beads is being packed, the flow through the bed slows down, which slowing is detected by the flow meter 118. Once the flow rate drops below a predetermined level, the packing process can be stopped.

Sample that has interacted with the active-surface microbeads can flow through a number of outlet nozzles 120 into outlet 122, which can be a reservoir, channel, or input into another system.

Figure 2:
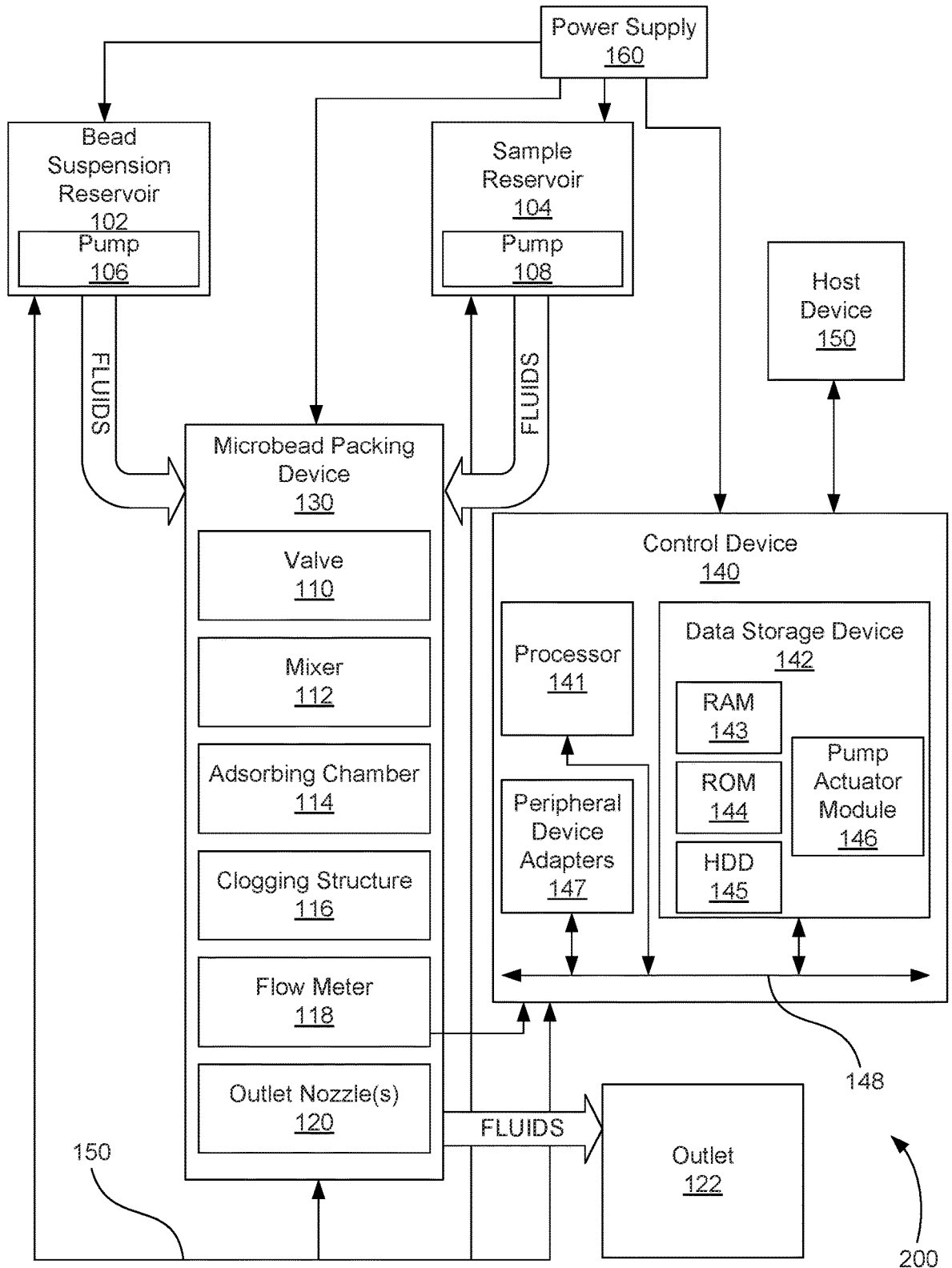
FIG. 2 is a block diagram depicting an example of a microfluidic bead-packing system.

FIG. 2 is a block diagram depicting an example of a microfluidic bead-packing system 200 that includes electronic control. As with the microfluidic bead-packing system 100 depicted in FIG. 1, the microfluidic bead-packing system 200 implements the collection and packing of active-surface microbeads in an adsorbing chamber 114 such that a number of sample fluids may efficaciously contact and interact with the packed active-surface microbeads.

In addition to bead suspension reservoir 102, sample reservoir 104, and their respective associated pumps 108, the microfluidic bead-packing system 200 includes microbead packing device 130, which can include valve 110, mixer 112, adsorbing chamber 114, bead clogging filter 116, flow meter 118, and outlet nozzle(s) 120, the respective functions of which have been described above with regard to FIG. 1

In one example, the microbead packing device 130 and its elements may be implemented as a chip-based device that can include valve 110, mixer 112, adsorbing chamber 114, clogging structure 116, flow meter 118, and outlet nozzle(s) 120, or combinations thereof. In another example, the microfluidic bead-packing system 200 may be implemented as a chip-based device. The structures and components of the chip-based microbead packing device 130 or microfluidic bead-packing system 200 may be fabricated using a number of integrated circuit microfabrication techniques such as electroforming, laser ablation, anisotropic etching, sputtering, dry and wet etching, photolithography, casting, molding, stamping, machining, spin coating, laminating, among others, or combinations thereof.

The microfluidic bead-packing system 200 can also include a control device 140 to control various components and functions of the system 200, such as the bead suspension reservoir pump 106, the sample reservoir pump 108, the microbead packing device 130, and its valve 110, mixer 112, flow meter 118, and outlet nozzle(s) 120. In some examples, control device 140 controls various microfluidic bead-packing system 200 functions, including the sequence and timing of activation pumps 106 and 108 to introduce bead suspension and sample into the adsorbing chamber 114 at the appropriate times. In some examples, control device 140 controls various functions of the microbead packing device 130 that provide for introduction and dispense of fluids into and out of the device 130 at appropriate times by, for example, opening and closing valve 110, or controlling outlet nozzle(s) 120. In some examples, control device 140 controls various functions of the microbead packing device 130 that provide for mixing, such as activating actuators, including inertial pumps, within the mixer 112 to mix fluid within the microbead packing device 130 and to move fluid through the microbead packing device 130.

To achieve its desired functionality, the control device 140 can include various hardware components. Among these hardware components may be a processor 141, a data storage device 142, a number of peripheral device adapters 147, and other devices for communicating with and controlling components and functions of microbead packing device 130, fluid reservoirs 102, 104, pumps 106, 108, and other components of microfluidic bead-packing system 200. These hardware components may be interconnected through the use of a number of busses and/or network connections. In one example, the processor 141, data storage device 142, peripheral device adapters 147 may be communicatively coupled via bus 148.

The processor 141 may include the hardware architecture to retrieve executable code from the data storage device 142 and execute the executable code. The processor 141 can include a number of processor cores, an application specific integrated circuit (ASIC), field programmable gate array (FPGA) or other hardware structure to perform the functions disclosed herein. The executable code may, when executed by the processor 141, cause the processor 141 to implement at least the functionality of controls various functions of the reservoirs 102, 104, pumps 106, 108, and microbead packing device 130, such as disclosed herein. In the course of executing code, the processor 141 may receive input from and provide output to a number of the remaining hardware components, directly or indirectly.

The processor 141 may also interface with a number of sensors, such as flow meter 118. The processor 141 may use an input from flow meter 118 to quantify flow rate, or may otherwise quantify the flow rate of fluid flowing in the various channels, including in the adsorbing chamber 114. The quantification of the flow rate may be done, for example, by measuring, calculating, or estimating. For example, the processor 141 may calculate or estimate the flow rate of fluid flowing through the microbead packing device based on known factors including the activation status of pumps 106, 108, the flow known to be produced by reservoirs 102, 104, the resistance to flow provided by the inlet channels, the outlet channel, and the microbead packing device 130, the viscosity or viscosities of the fluid or fluids flowing through the microbead packing device 130, the activation state of actuators or inertial pumps in mixer 112, and the positive or negative contribution of such actuators or inertial pumps to flow, among other factors. Whether the flow rate is quantified through measurement, estimation, or calculation, the control device 140 can determine that the quantified flow rate through the filter 116 has fallen below a predetermined threshold level and can stop the bead-packing process by controlling pumps 106, 108, valve 110, and/or outlet nozzle(s) 120.

The data storage device 142 may store data and/or instructions such as executable program code that is executed by the processor 141 or other processing device. The data storage device 142 may specifically store a number of applications that the processor 141 executes to implement at least the functionality described herein. The data storage device 142 may include various types of memory modules, including volatile and nonvolatile memory. For example, the data storage device 142 of the illustrated example includes random-access memory (RAM) 143, read-only memory (ROM) 144, flash solid state drive (SSD), and hard disk drive (HDD) memory 145. Many other types of memory may also be utilized, and the present specification contemplates the use of many varying type(s) of memory in the data storage device 142 as may suit a particular application of the principles described herein. In certain examples, different types of memory in the data storage device 142 may be used for different data storage needs. For example, in certain examples the processor 141 may boot from ROM 144, maintain nonvolatile storage in the HDD memory 145, and execute program code stored in RAM 143.

In this manner, the control device 140 includes a programmable device that includes machine-readable or machine-usable instructions stored in the data storage device 142, and executable on the processor 141 to control pumping and mixing processes within microfluidic bead-packing system 200. Such modules may include, for example, a pump actuator module 146 to implement sequence and timing instructions for selectively activating and deactivating the pumps 106 and 108.

In one example, the control device 140 may receive data from a host device 150, such as a computer, and temporarily store the data in the data storage device 142. The data from the host 150 represents, for example, executable instructions and parameters for use alone or in conjunction with other executable instructions in other modules stored in the data storage device 142 of the control device 140 to control fluid flow, fluid mixing, and other related functions within the microfluidic bead-packing system 200 and its microbead packing device 130. For one example, the data executable by processor 141 of the control device 140 may timely enable and disable pumping by pumps 106, 108 to fill adsorbing chamber 114 with microbeads followed by introduction of sample fluid. For another example, the data executable by processor 141 of the control device 140 may enable selective and controlled activation of a number of micro-inertial actuators within the mixer 112 through precise control of the sequence, timing, frequency and duration of fluid displacements generated by the actuators. Modifiable (i.e., programmable) control over the actuators via the data and actuator sequence and timing instructions enables any number of different mixing process protocols to be performed on different implementations of the mixer 112 within the microbead packing device 130. In one example, mixing protocols may be adjusted on-the-fly for a given mixer 112 in response to sensed parameters and/or user inputs from the host devices.

The microfluidic bead-packing system 200 may also include a number of power supplies 160 to provide power to the bead suspension reservoir 102 and its pump 105, the sample reservoir 104 and its pump 108, the control device 140, and the microbead packing device 130 and its valve 110, mixer 112, flow meter 118, and outlet nozzle(s) 120, along with other electrical components that may be part of the microfluidic bead-packing system 200.

As in FIG. 1, although two source fluid reservoirs 102, 104 are depicted in FIG. 2, any number of fluids may be accommodated with the addition of more reservoirs 102, 104 and associated channels. Channels are indicated in FIG. 2 by large arrows labeled "fluids." Microbead packing device 130 may also include a channel or channels that include or link its elements 110-120.

Figure 3A:
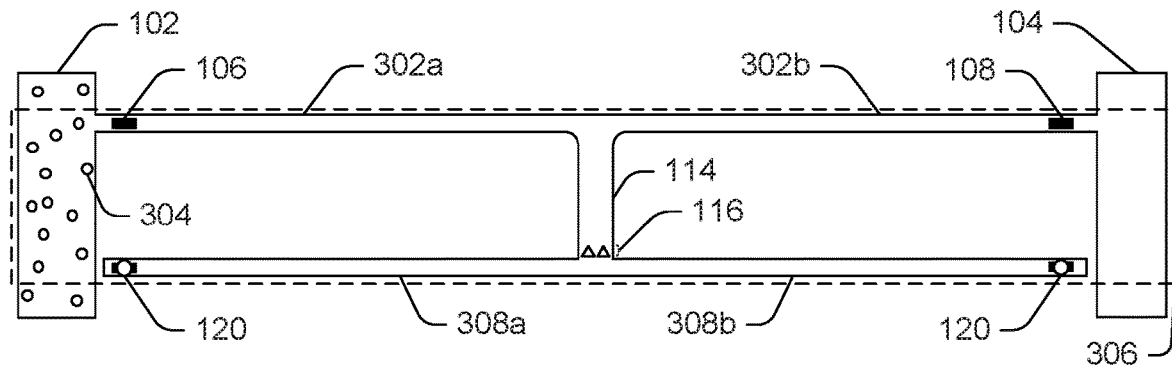
FIGS. 3A-3C are cross-sectional diagrams of an example microbead packing system at various stages of operation.
Figure 3B:
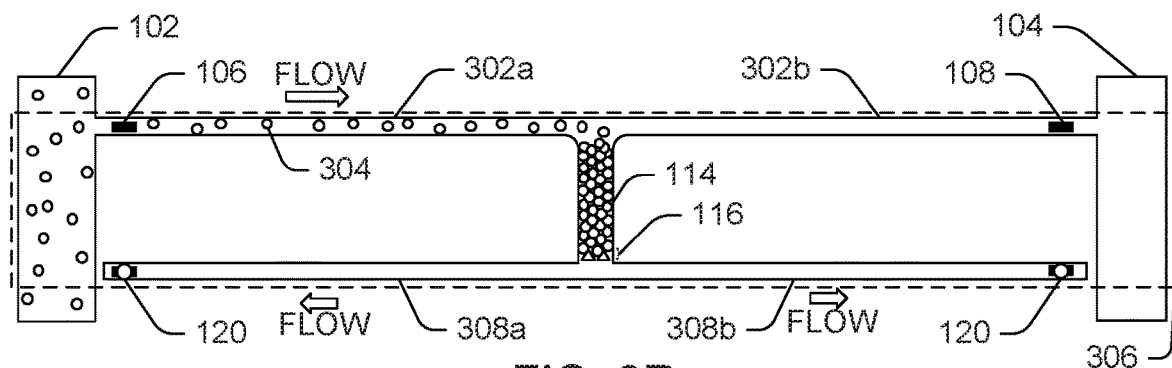
Figure 3C:
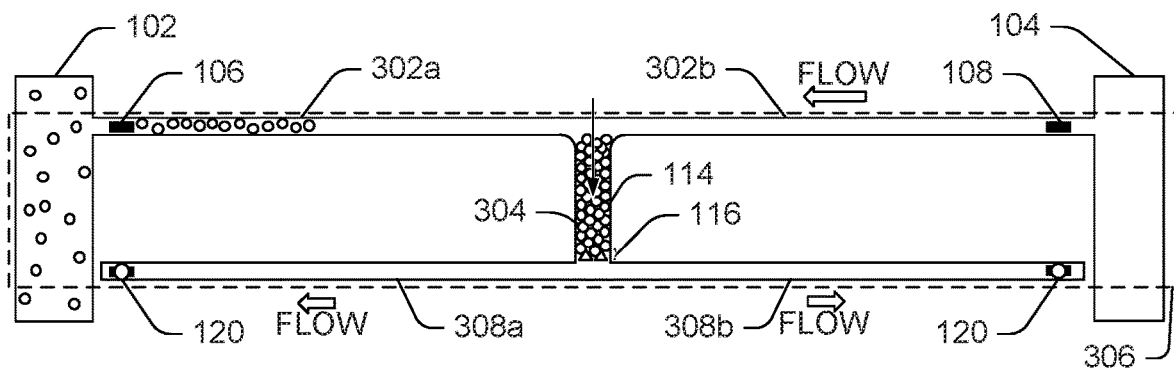

FIGS. 3A-3C are cross-sectional diagrams of an example microbead packing device and associated reservoirs and channels illustrating the timing at different process stages to produce the flow of fluids and the packing of microbeads 304.

FIG. 3A depicts the starting state of the illustrated example system. A first pump 106 associated with a reservoir 102 containing a suspension of active-surface microbeads 304 and a second pump 108 associated with a reservoir 104 of sample fluid containing objects of interest (too small to be shown) are both turned off. A portion 302a of an inlet channel leads from bead suspension reservoir 102 to an inlet end of adsorbing channel 114. Another portion 302b of the inlet channel leads from sample reservoir 104 to the inlet end of adsorbing channel 114. A bead clogging structure 116 can include, for example, one or more constriction or filter. In the illustrated example, bead clogging structure is illustrated as a filter that is located at the outlet end of the adsorbing channel 114.

By way of further example, the filter 116 can constitute an arrangement of posts and one or more gaps between the posts. The posts can be shaped, for example, as high-aspect-ratio pillars of triangular cross-section. By "high aspect ratio," it is meant that the posts are taller than they are wide. The posts can be arranged, for example, in a line across an outlet opening in the adsorbing channel 114, like teeth of a comb, or in an array, with a number of rows of posts. The posts can be made of an epoxy material, for example an epoxy-based negative photoresist, for example SU-8. SU-8 is the name for a particular negative, epoxy-type, acid-catalyzed, near-UV photoresist, which derives its name from the presence of 8 epoxy groups, and is commercially available from MicroChem Corp. of Westborough, Mass. among other vendors. The posts and gaps of the filter 116 can be sized so as to permit flow of the objects of interest of the sample fluid, but not the comparatively larger microbeads 304. For example, the gaps can be just smaller than the expected smallest microbead size. Although adsorbing channel 114 is depicted as a straight channel, in some examples it can be increased in length by forming it as a serpentine shape.

FIG. 3B depicts a second, priming stage of the illustrated example system. Following the starting state shown in FIG. 3A, first pump 106 associated with a reservoir 102 containing a suspension of active-surface microbeads 304 is activated to organize flow that predominantly draws from the portion 302a of the inlet channel that draws from bead suspension reservoir 102. Bead suspension fluid flows through adsorbing channel 114 and through a number of outlet channels 308a, 308b and outlet nozzles 120, which are likewise activated. The activations may be controlled by control device 140 (shown in FIG. 2). The flow directions are as indicated by arrows. Beads 304 in the bead suspension are prevented from entering outlet channels by constriction or filter 116, and thus collect and tightly pack in adsorbing channel 114. Bead suspension fluid, absent beads, is drawn off through nozzles 120 to waste chamber or dispenser (FIG. 1, 122).

Once the adsorbing channel 114 is packed, by deactivating bead suspension reservoir pump 106 and activating sample reservoir pump 108, the intake flow through the inlet channel 302a, 302b is reversed in the sample analysis stage depicted in FIG. 3C. Sample fluid, including objects of interest, is drawn from the sample reservoir 104 by the action of sample reservoir pump 108 and forced to pass through the active-surface coated microbeads 304, as indicated by the thin central arrow in FIG. 3C. Through contact and interaction with the beads, the desired function is achieved. The particular function desired is dependent upon the application. Functions may include adsorption and separation.

Pump 108 may be used to prevent flow down channel 302b during the bead filling stage shown in FIG. 3A. Likewise, pump 106 may be used to prevent flow down channel 302a. These pumps 106, 108 can push fluid that comes through the channels 302a, 302b back out. A number of flow meters (see, e.g., FIGS. 1 and 2, 118) can be placed in these channels 302a, 302b, 308a, 308b can detect the direction of flow to determine that flow in any particular channel is in the desired direction.

Figure 3D:
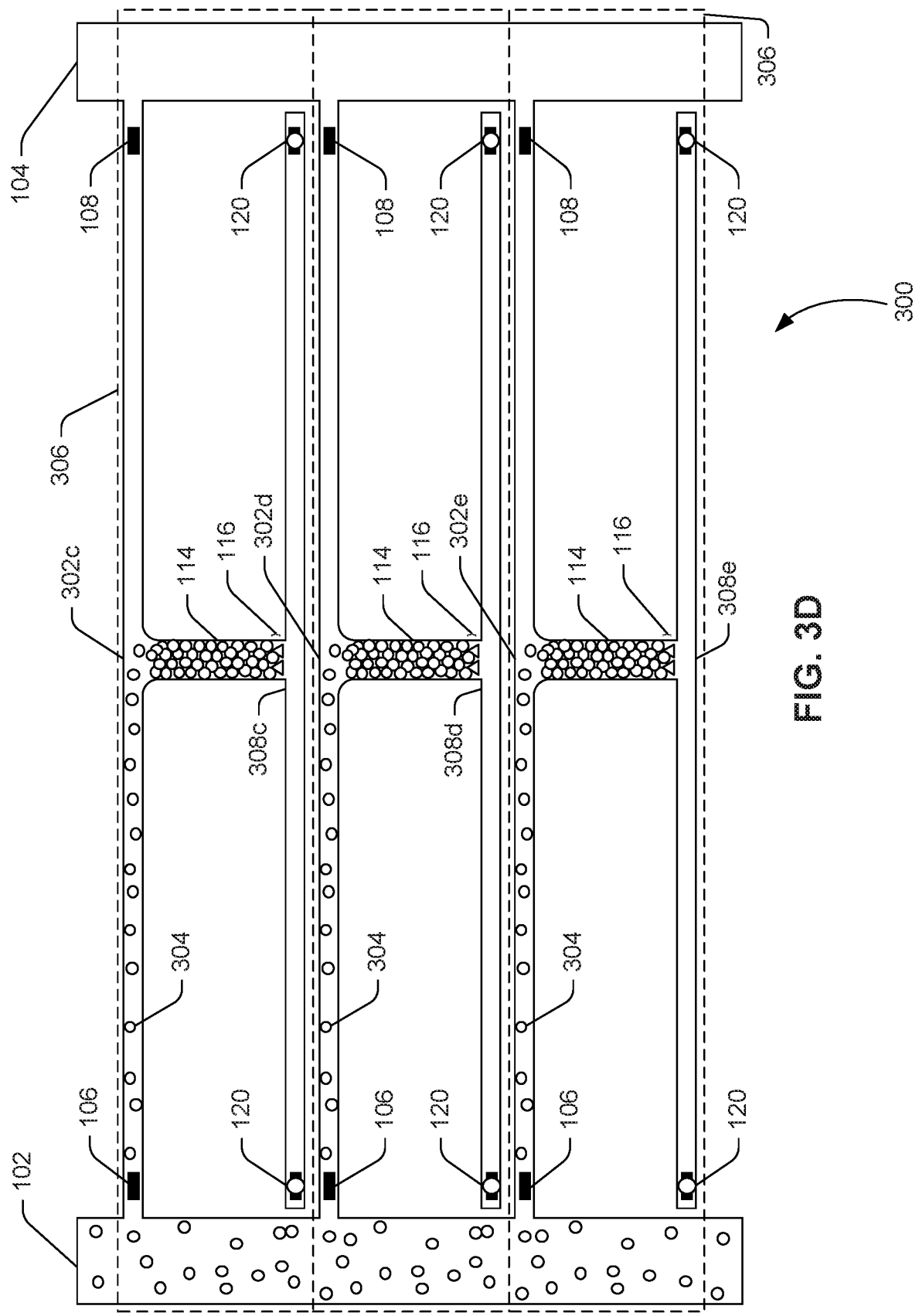
FIG. 3D is a cross-sectional diagram of an example parallel microbead packing system.

A broken-line outline 306 surrounds illustrated components of the system that together can be considered a single unit of a multi-unit parallel system. FIG. 3D depicts an example of such a parallel system consisting of a plurality of units 306. In FIG. 3D, there may be a single bead suspension reservoir 102 and a single sample reservoir 104 feeding multiple parallel inlet channels 302c, 302d, 302e and corresponding multiple parallel outlet channels 308c, 308d, 308e. Multiple nozzles 120 drain the outlet channels. The pumps 106, 108 and nozzles 120 may be controlled to coordinate the operation of each of the parallel systems. The operation of the parallel units may be controlled such that the units work through the stages of bead packing simultaneously or at different times from each other. Parallelizing the bead-packing system along the reservoirs can increase flow rates and sample volumes to arbitrary levels and thus permits scalability of the system while preserving desired or known optimal adsorbing channel 114 dimensions. Such desired or known optimal dimensions may be dependent upon microbead 304 sizes, desired flow rates, and desired bead-sample interaction times, among other factors.

Figure 4:
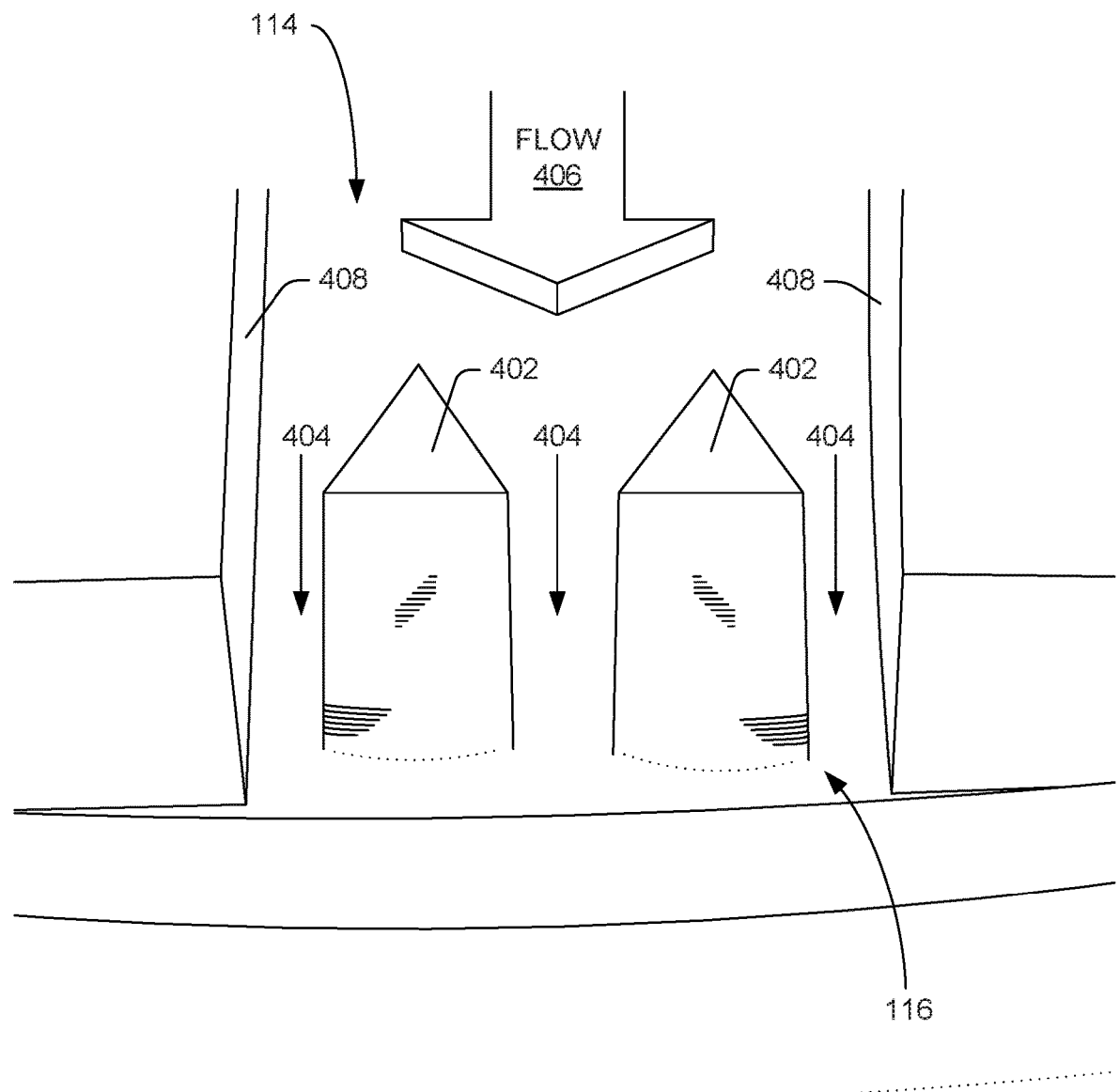
FIG. 4 is a perspective view of an example filter in an example microbead packing device.

FIG. 4 depicts a perspective view of an example microfabricated filter 116 looking up the adsorbing channel 114. In the illustrated example, filter 116 is made of up of two posts 402 that extend longitudinally along the direction of fluid flow. The spacing between the posts 402, and between posts 402 and channel walls 408, define gaps 404. The gaps 404 are large enough to pass objects of interest in the sample fluid but small enough to prevent passage of microbeads. Although two posts 402 of identical size and shape are shown in the example, the filter 116 can consist of any number of posts and the posts can vary in size and shape. The posts 402 can be fabricated of SU-8 or any other suitable material that may depend on the intended use of the filter and mixer in which it is implemented. Direction of flow through the channel 114 is as indicated by arrow 406.

Whether the system uses a single unit 306, as in the examples of FIGS. 3A-3C, or multiple units 306, as in the example of FIG. 3D, beads 304 may be all of the same size or may be mixtures of different sizes. Using mixtures of different sizes of beads 304 can increase the packing density of beads 304, increase the active surface area, and decrease the average gap size between the beads.

The number of nozzles 120 and pumps 106, 108 can also be increased or decreased, or adjusted in size or effectiveness, to provide desired flow rate and pressure in the system.

Figure 5:
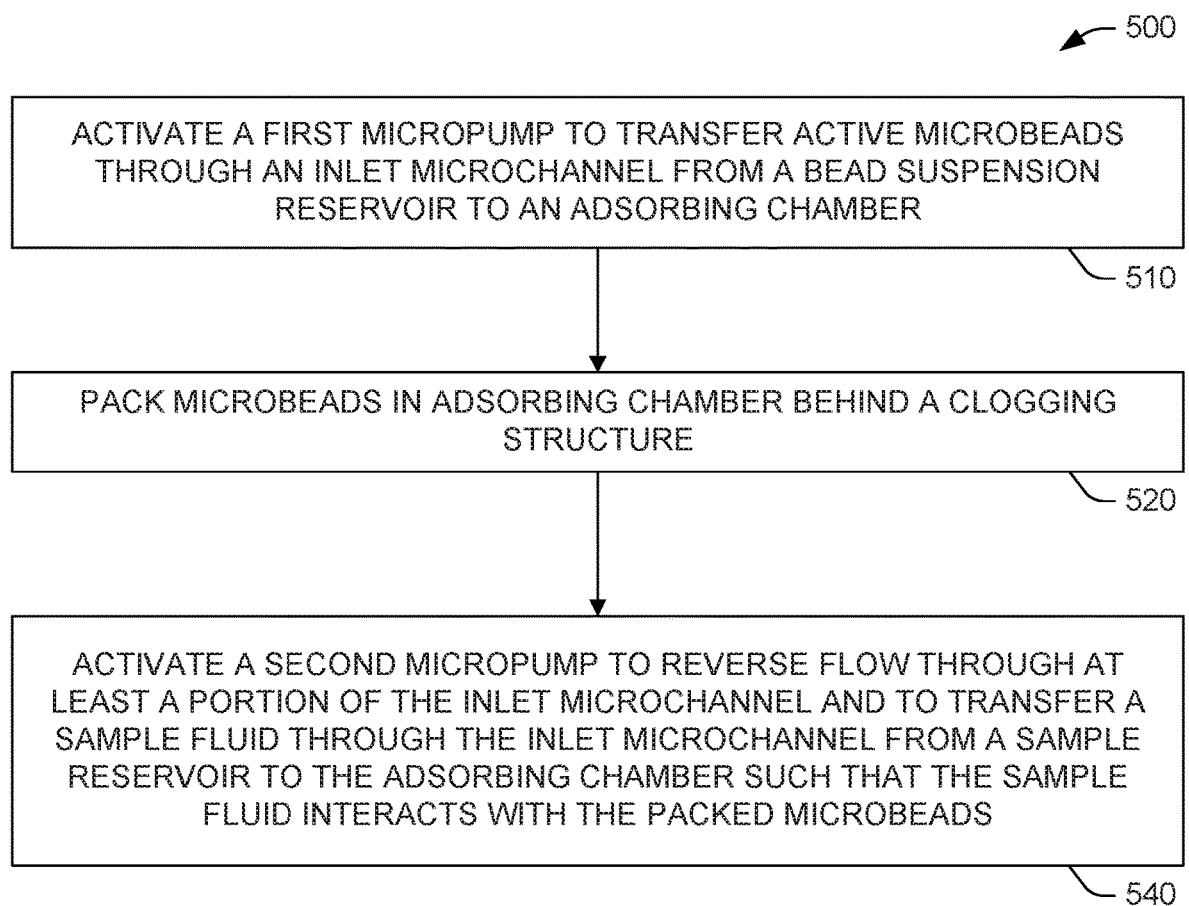
FIG. 5 is a flowchart showing an example microbead packing method.
Figure 6:
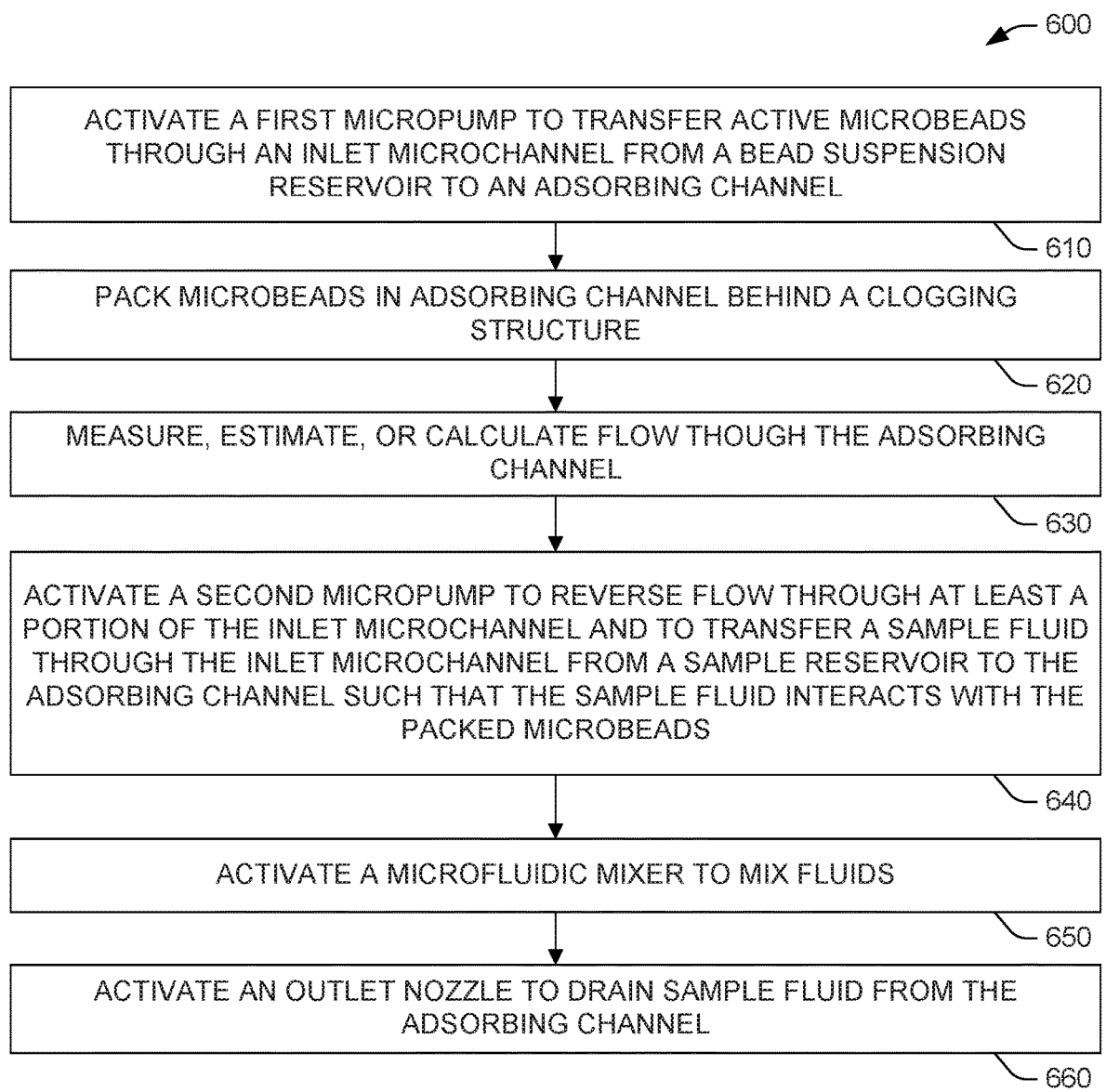
FIG. 6 is a flowchart showing another example microbead packing method.

FIGS. 5 and 6 are flowcharts showing example methods of microfluidic channel bead packing. Examples of systems and methods are described herein with reference to flowchart illustrations and/or block diagrams of methods, apparatus (systems) and computer program products according to examples of the principles described herein. Each block of the flowchart illustrations and combinations of blocks in the flowchart illustrations may be implemented by computer-usable program code. The computer-usable program code may be provided to or accessed by a processor of a general purpose computer, special purpose computer, or other programmable data processing apparatus, such that the computer-usable program code, when executed via, for example, the processor 141 of the control device 140 or other programmable data processing apparatus, implements and/or causes the functions or acts specified in the flowchart and/or block diagram block or blocks. In one example, the computer-usable program code may be embodied within a computer-readable storage medium, the computer-readable storage medium being part of the computer program product. In one example, the computer-readable storage medium is a non-transitory computer-readable medium.

The method 500 of FIG. 5 may begin 510 by activating a first micropump (FIGS. 1-3D, 106) to transfer active microbeads (FIGS. 3A-3D, 304) through an inlet microchannel (FIGS. 3A-3C, 302a) from a bead suspension reservoir (FIGS. 1-3D, 102) to an adsorbing chamber (FIGS. 1-4, 114). Next, microbeads (FIGS. 3A-3D, 304) are packed 520 in the adsorbing chamber (FIGS. 1-4, 114) behind a clogging structure (FIGS. 1-4, 116). Following bead packing, a second micropump (FIGS. 1-3D, 108) is activated 540 to reverse flow through at least a portion of the inlet microchannel (FIGS. 3A-3C, 302a) and to transfer a sample fluid through the inlet microchannel (FIGS. 3A-3C, 302b) from a sample reservoir (FIGS. 1-3D, 104) to the adsorbing chamber (FIGS. 1-3D, 114).

The method 600 of FIG. 6 includes additional actions over those shown in the sequence 510, 520, and 540 of FIG. 5. The method 600 may begin 610 by activating a first micropump (FIGS. 1-3D, 106) to transfer active microbeads (FIGS. 3A-3D, 304) through an inlet microchannel (FIGS. 3A-3C, 302a) from a bead suspension reservoir (FIGS. 1-3D, 102) to an adsorbing channel (FIGS. 1-4, 114). A control device (FIG. 2, 140) may be used to activate the first micropump (FIGS. 1-3D, 106) to draw bead suspension fluid from the bead suspension reservoir (FIGS. 1-3D, 102), and pump it into the adsorbing channel (FIGS. 1-4, 114). The processor (FIG. 2, 141) may execute the pump actuator module (FIG. 2, 146) in order to signal the pump (FIGS. 1-3D, 106) and outlet nozzle(s) (FIGS. 1-3D, 120) via electrical connection (FIG. 2, 150).

The method 600 may continue 620 by packing microbeads (FIGS. 3A-3D, 304) in the adsorbing channel (FIGS. 1-4, 114) behind a clogging structure (FIGS. 1-4, 116). For instance, the clogging structure (FIGS. 1-4, 116) may be a constriction, a filter, or a combination of a number of constrictions and filters, may consist, for example, of a number of posts (FIG. 4, 402), for example SU-8 posts, defining gaps (FIG. 4, 404) large enough to permit for passage of objects of interest in a sample fluid, but small enough to block the passage of microbeads (FIGS. 3A-3D, 304). A flow meter (FIGS. 1-2, 118) may be used to measure flow 530 through the adsorbing channel (FIGS. 1-4, 114), and the measurement may inform the control device (FIG. 2, 140) when flow through the adsorbing channel (FIGS. 1-4, 114) has fallen below a predetermined threshold, which may cause the control device (FIG. 2, 140) to initiate the next phase of the method. Alternatively or additionally, the control device (FIG. 2, 140) may measure, calculate, or estimate flow 630 in other ways, as described herein.

Following bead packing, the method 600 continues to 640 with activating a second micropump (FIGS. 1-3D, 108) to reverse flow through at least a portion of the inlet microchannel (FIGS. 3A-3C, 302a) and to transfer a sample fluid through the inlet microchannel (FIGS. 3A-3C, 302b) from a sample reservoir (FIGS. 1-3D, 104) to the adsorbing channel (FIGS. 1-3D, 114). For instance, the control device (FIG. 2, 140) may be used to activate the second micropump (FIGS. 1-3D, 108) to draw sample fluid from the sample reservoir (FIGS. 1-3D, 104), and pump the sample fluid through the inlet channel (FIGS. 3A-3C, 302b) into the adsorbing channel (FIGS. 1-4, 114). The processor (FIG. 2, 141) may execute the pump actuator module (FIG. 2, 146) in order to signal the pump (FIGS. 1-3D, 108) and outlet nozzle(s) (FIGS. 1-3D, 120) via electrical connection (FIG. 2, 150). In this manner, the sample fluid is permitted to interact with the packed microbeads (FIGS. 3A-3D, 304).

In some instances, the method 600 can include activating 650 a microfluidic mixer (FIGS. 1-2, 112) to mix fluids, such as sample fluid and/or bead suspension fluid. The mixer (FIGS. 1-2, 112) can be a passive mixer or an active mixer, and can mix, stir, and/or agitate microbeads and sample, promoting efficient extraction via adsorption. For instance, the control device (FIG. 2, 140) may be used to activate and coordinate inertial pumps in the mixer (FIG. 1, 112), which may be activated at a number of frequencies based on a desired amount of mixing and flow of fluids. In some examples, the mixer can include a number of mixing devices. In some examples, the mixer can be located in the adsorbing channel 114. In some examples, the mixer can be located in an inlet channel, such as channel 302b in FIGS. 3A-3D, to agitate sample fluid or to mix a number of distinct sample fluids. In some examples, the mixer can include devices in both the adsorbing channel 114 and an inlet channel.

The method 600 can also include activating 660 an outlet nozzle (FIGS. 1-3, 120) to drain sample fluid from the adsorbing channel (FIGS. 1-3D, 114). The sample fluid can be drained, for example, to an outlet (FIGS. 1-2, 122), which can be, for example, a waste chamber, a dispenser, or a port to a later stage of a larger microfluidic analysis system of which the bead-packing adsorbing channel 114 is a part.

Although the illustrated examples depict two-fluid designs, the system can be generalized to multi-fluid designs by adding additional channels. In some applications, such as polymerase chain reaction (PCR) sample preparation, after the bead-sample interaction, the beads may be washed with a buffer in an elution step. The resulting elute may then be passed for further processing. Multi-fluid designs allow elute to be moved to another reaction chamber downstream.

The beads 304 may be round or of any desirable shape. Beads with a number of "self-assembly" properties can be used. Self-assembling beads are specially shaped and/or have special active groups that can physically and/or chemically "lock" the beads together and/or attach them to the adsorbing channel 114 walls. Such self-assembling particles may create beds with higher packing densities.

The microfluidic bead-packing system 100, microbead packing device 130, system 200, and/or parallel system 300 may be used for a variety of applications. In one example, the devices or systems can be used to perform on-chip or on-die liquid chromatography for separating analytes by molecular weight, in which the molecules in a mixture are separated in space according to their mobility and strength of interaction with the stationary phase.

In another example, the devices or systems can be used to perform "extraction through absorption," involving absorption of negatively charged molecules on positively charged silica surfaces. The negatively charged molecules may be, for example, DNA strands from a lysed biological sample.

In yet another example, the principles described herein can be used to create dense filters with characteristic gap sizes smaller than what is possible lithographically.

In still another example, the devices or systems described herein can be used to concentrate the sample through reuse of the filter's sediment.

In some examples of the devices and systems described herein, the microbead packing channel (e.g., adsorbing channel 114) and associated components can be fabricated in a one-time use, disposable component. Such a disposable component can be removable, modular, and replaceable. In some examples, it may not be necessary to remove or recover waste microbeads from the packed bed, and thus the packed beads may be disposed of along with the rest of the device or system. In other examples, additional channels and pumps can be provided to supply appropriate flow to remove the microbeads from the adsorbing channels and recover them to an appropriate receptacle.

In another example of the system of FIGS. 1 and 2, adsorbing reservoir 114 can be prefilled with dry beads during the fabrication process, eliminating the need for adsorbing suspension reservoir 102 and its associated pump 106. A number of sample reservoirs 104 can then be used for sample fluid delivery to absorbing reservoir 114. The introduction of sample fluid into adsorbing reservoir 114 achieves the bead packing. In this example, bead suspension reservoir 102 and its associated pump 106 can be repurposed for elution fluid storage and delivery. Elution fluid delivered from reservoir 102 produces a concentrated analyte after filter 116 that can be used for post-processing or detection, via dispenser 122. In this example, mixer 112 can be located in or combined with absorbing reservoir 114. An example method of using such an example system can include the steps of activating a micropump to transfer a sample fluid through an inlet microchannel 302b from a sample reservoir 104 to an adsorbing reservoir 114 containing a number of active microbeads 304 such that the microbeads 304 are packed in the adsorbing reservoir 114 and such that the sample fluid interacts with the packed microbeads 304, and activating a microfluidic mixer in the adsorbing reservoir 114 to mix the sample fluid and microbeads 304. Such an example method can further include activating an outlet nozzle 120 to drain the sample fluid from the adsorbing reservoir 114.

In view of the foregoing, the microfluidic devices, systems, and methods disclosed herein provide effective bead-packing solutions. The systems, devices and methods can provide automated packing of microfluidic channels with active beads. The systems, devices, and methods can be used with a large number of bead types of different sizes, geometries, and/or with different active surfaces, providing versatility of use. The systems can be scaled to large sample volumes while maintaining high flow rates.

The preceding description has been presented to illustrate and describe examples of the principles described. This description is not intended to be exhaustive or to limit these principles to any precise form disclosed. Many modifications and variations are possible in light of the above teaching. What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method comprising:
   for each of a plurality of parallel microfluidic bead-packing devices:
   activating a first micropump to transfer active microbeads through an inlet microchannel from a bead suspension reservoir to an adsorbing channel;
   packing the microbeads in the adsorbing channel; and
   activating a second micropump to reverse flow through at least a portion of the inlet microchannel and to transfer a sample fluid through the inlet microchannel from a sample reservoir to the adsorbing channel such that the sample fluid interacts with the packed microbeads, the first micropump and the second micropump being integrated within the inlet microchannel;
   wherein the bead suspension reservoir and the sample reservoir are shared among and connected to each of the plurality of parallel microfluidic bead-packing devices.

2. The method of claim 1, further comprising quantifying flow through the adsorbing channel.

3. The method of claim 2, wherein the activating the second micropump is based on determining that the quantified flow through the adsorbing channel is less than a predetermined threshold.

4. The method of claim 3, wherein the flow through the adsorbing channel is measured with a flow meter.

5. The method of claim 1, further comprising activating a microfluidic mixer located in the adsorbing channel.

6. The method of claim 1, further comprising activating an outlet nozzle to drain the sample fluid from the adsorbing channel.

7. The method of claim 1, wherein a bead clogging structure is located between the adsorbing channel and an outlet microchannel to pack the microbeads in the adsorbing channel.

8. The method of claim 7, wherein the bead clogging structure comprises a number of posts and gaps located between the adsorbing channel and the outlet microchannel to pack the microbeads in the adsorbing channel and to permit flow of the sample fluid from the adsorbing channel to the outlet microchannel.

9. A microfluidic bead-packing system comprising:
   a plurality of microbead packing devices, each of the plurality of microbead packing devices including:
   an adsorbing chamber to pack together a plurality of microbeads;
   an inlet microchannel fluidly coupled to a bead suspension reservoir associated with a first micropump, a sample reservoir associated with a second micropump, and the adsorbing channel;
   a bead clogging filter;
   an outlet nozzle; and
   the first micropump and the second micropump integrated within the inlet microchannel; and
   the bead suspension reservoir associated with the first micropump, the bead suspension reservoir fluidly coupled to each of the plurality of the microbead packing devices;
   the sample reservoir associated with the second micropump, the sample reservoir fluidly coupled to each of the plurality of the microbead packing devices; and
   a control device electrically coupled to each of the first micropump and the second micropump to sequentially provide fluids from the bead suspension reservoir and the sample reservoir to the adsorbing chamber and activate each of the first and second micropumps and outlet nozzle;
   wherein each of the plurality of microbead packing devices are connected in a parallel arrangement between the bead suspension reservoir and the sample reservoir, the bead suspension reservoir and the sample reservoir being shared among each of the plurality of microbead packing devices.

10. The system of claim 9, wherein the bead clogging filter comprises a number of posts and gaps between the adsorbing chamber and the outlet nozzle.

11. The system of claim 9, wherein each of the plurality of microbead packing devices further comprise a microfluidic mixer to mix fluids and a flow meter to measure flow through the adsorbing chamber.

12. The system of claim 11, wherein each of the microfluidic mixer is an active mixer and is electrically coupled to and controlled by the control device.

13. A microfluidic bead-packing system comprising:
   a plurality of parallel microfluidic bead-packing devices, wherein each of the plurality of microfluidic bead-packing devices include:
   an adsorbing channel to pack a plurality of active-surface microbeads;
   an inlet microchannel fluidly coupled to a bead suspension reservoir associated with a first micropump, a sample reservoir associated with a second micropump, and the adsorbing channel;
   the first micropump and the second micropump integrated within the inlet microchannel;
   an outlet microchannel fluidly coupled to the adsorbing channel and including an outlet nozzle; and
   a bead clogging structure between the adsorbing channel and the outlet microchannel;
   wherein the first micropump, the second micropump, and the outlet nozzle each have electrical control connections and are activated in sequence to introduce the plurality of active-surface microbeads into the adsorbing channel, introduce sample fluid into the adsorbing channel, and drain sample fluid from the adsorbing channel through the outlet microchannel via the outlet nozzle, in that order;
   wherein the bead suspension reservoir and the sample reservoir are shared among and connected to each of the plurality of parallel microfluidic bead-packing devices.

14. The microfluidic bead-packing system of claim 13, wherein each of the bead clogging structures is a filter that comprises a plurality of posts arranged to form gaps large enough to permit passage of objects of interest in the sample fluid but small enough to block passage of the plurality of active-surface microbeads.

* * * * *